United States Patent [19]

Tanaka et al.

[11] Patent Number: 5,125,557
[45] Date of Patent: Jun. 30, 1992

[54] CERAMICS BONDED PRODUCT AND METHOD OF PRODUCING THE SAME

[75] Inventors: Shun-ichiro Tanaka; Kazuo Ikeda; Akio Sayano, all of Yokohama, Japan

[73] Assignee: Kabushiki Kaisha Toshiba, Japan

[21] Appl. No.: 726,714

[22] Filed: Jul. 1, 1991

Related U.S. Application Data

[63] Continuation of Ser. No. 370,110, Jun. 22, 1989, abandoned, which is a continuation of Ser. No. 655,060, Sep. 27, 1984, abandoned.

[30] Foreign Application Priority Data

Sep. 30, 1983 [JP] Japan .................................. 58-182093

[51] Int. Cl.⁵ .............................................. B23K 31/00
[52] U.S. Cl. .................................. 228/121; 228/124; 228/198
[58] Field of Search .............. 228/121, 124, 198, 203, 228/218, 263.12; 264/DIG. 76

[56] References Cited

U.S. PATENT DOCUMENTS

| | | | |
|---|---|---|---|
| 2,857,663 | 10/1958 | Beggs | 29/473.1 |
| 4,226,932 | 10/1980 | Ferraris | 428/432 |
| 4,357,382 | 11/1982 | Lambert et al. | 428/698 |
| 4,448,853 | 5/1984 | Fischer et al. | 428/660 |
| 4,532,190 | 7/1985 | Kanbe et al. | 428/627 |
| 4,624,897 | 11/1986 | Ito | 428/660 |
| 4,824,008 | 4/1989 | Luszcz et al. | 228/121 |

Primary Examiner—Samuel M. Heinrich
Attorney, Agent, or Firm—Foley & Lardner

[57] ABSTRACT

Disclosed is a ceramics bonded product, which comprises a ceramics sintered body bonded to another ceramics sintered body or a metal member through a ductile metal and a group IVa transition metal nitride interposed therebetween. Also disclosed is a method of producing a ceramics bonded product, which comprises bonding a ceramics sintered body and another ceramics sintered body or a metal member by allowing a ductile metal and a group IVa transition metal nitride to exist therebetween.

16 Claims, 2 Drawing Sheets

CERAMICS BONDED PRODUCT AND METHOD OF PRODUCING THE SAME

This application is a continuation of application Ser. No. 07/070,110, filed Jun. 22, 1989, now abandoned, which is a continuation of application Ser. No. 06/655,060, filed Sep. 27, 1984 now abandoned.

BACKGROUND OF THE INVENTION

This invention relates to a novel ceramics bonded product having great bonded strength and suffering hardly from cracks or breaking in the vicinity of the bonded interface even when receiving heat shock, and also to a method of producing the same.

Heretofore, as the method for bonding a metal member to a ceramics sintered body such as of alumina, there has been generally employed a method in which molybdenum paste is baked onto the surface of a ceramics sintered body, metallizing treatment is applied thereon and thereafter nickel plating is conducted, followed by soldering to effect bonding. However, this method involves a drawback that the pre-treatment procedures are very complicated.

In recent years, as substitute for such a method, studies have been made about a simpler method to bond a metal member directly to a ceramics sintered body. For example, there has been developed a method in which a metal member is brought into contact with a metal member and heated in a gas atmosphere containing a binding agent such as oxygen, or a method in which a metal member containing a binding agent is brought into contact with a ceramics sintered body and heated in a non-oxidative atmosphere.

However, according to such ceramics-metal bonded products of the prior art, the pre-treatment steps are complicated in all the methods. Besides, as compared with the coefficient of linear expansion of a ceramics sintered body, for example, that of $Si_3N_4$ which is as small as 2.46 to $4.1 \times 10^{-6}/°C.$, that of conventionally employed iron is very great as 10 to $15 \times 10^{31\ 6}/°C.$, and therefore difficulties were involved in that cracks may be formed in the vicinity of the bonded interface of ceramics, even resulting in breaking in some cases.

On the other hand, as the method for bonding a ceramics sintered body to a ceramics sintered body, other than the metallizing treatment as described above, development has been made about direct bonding between a ceramics sintered body and a ceramics sintered body through a copper foil or a metal foil of the group IVa transition metal (disclosed in U.S. Pat. No. 2,857,633). However, according to the bonding method using copper foil, the bonding strength is insufficiently not higher than 10 kg/mm², and according to any method, when abrupt heat shock is given, cracks are liable to be formed in the vicinity of the bonded surface, until it may be broken disadvantageously.

SUMMARY OF THE INVENTION

The present inventors have made extensive studies in order to cancel the drawbacks of the prior art, and consequently found that a ceramics bonded product having a great bonded strength and suffering hardly from generation of cracks at the bonded interface by heat shock can be obtained by allowing a ductile metal and a nitride of a group IVa transition metal to exist between a ceramics sintered body and another ceramics sintered body or a metal member to be bonded; more specifically, it can be obtained by heating, for instance, a nitride ceramics sintered body and another nitride ceramics sintered body or a metal member with a ductile metal and a transition metal of the group IVb interposed therebetween.

This invention has been accomplished on the basis of such a finding, and it is intended to provide a ceramics bonded product having a great bonded strength and also free from cracks or breaking even by abrupt heat shock.

More specifically, the ceramics bonded product of this invention is characterized in that a ceramics sintered body is bonded to another ceramics sintered body or a metal member through a ductile metal and a group IVa transition metal nitride interposed therebetween.

DESCRIPTION OF THE PREFERRED EMBODIMENTS

The ceramics bonded product can be prepared by allowing a ductile metal and a nitride of a group IVb transition metal to exist between a ceramics sintered body and another ceramics sintered body or a metal member to be bonded, for example, according to either of the following methods (A) to (D).

(A) Between a nitride ceramics sintered body and another nitride ceramics sintered body or a metal member, a ductile metal is provided, and between the ductile metal and the nitride ceramics sintered body or the metal member is interposed a layer comprising a group IVb transition metal powder, a group IVb transition metal compound powder capable of reacting with nitrogen or a group IVb transition metal nitride powder, and heating is carried out in an inert or reducing atmosphere at a temperature not lower than the melting point of the intermediary materials.

(B) Between a nitride ceramics sintered body and another nitride ceramics sintered body or a metal member, a compact comprising a mixed powder of powder of a ductile metal with powder of a group IVb transition metal, a powder of a group IVb transition metal compound capable of reacting with nitrogen or a powder of a group IVb metal nitride is permitted to exist, and heating is carried out in an inert or reducing atmosphere at a temperature not lower than the melting point of the intermediary materials.

(C) Between a nitride ceramics sintered body and another nitride ceramics sintered body or a metal member, a ductile metal is provided, and between the ductile metal and the nitride ceramics sintered body or the metal member is interposed a group IVb transition metal, a group IVb transition metal compound capable of reacting with nitrogen or a group IVb metal nitride provided in a locally, nonuniformly or intermittently distributed fashion, and heating is carried out in an inert or reducing atmosphere at a temperature not lower than the melting point of the intermediary materials.

(D) Between a nitride ceramics sintered body and another nitride ceramics sintered body or a metal member, a compact comprising a powder of a ductile metal and containing a group IVb transition metal fibers embedded therein is interposed, and heating is carried out in an inert or reducing atmosphere at a temperature not lower than the melting point of the intermediary materials.

With reference to the drawings, the methods of (A) to (D) will be described below in detail.

The method of (A)

Figure 1:
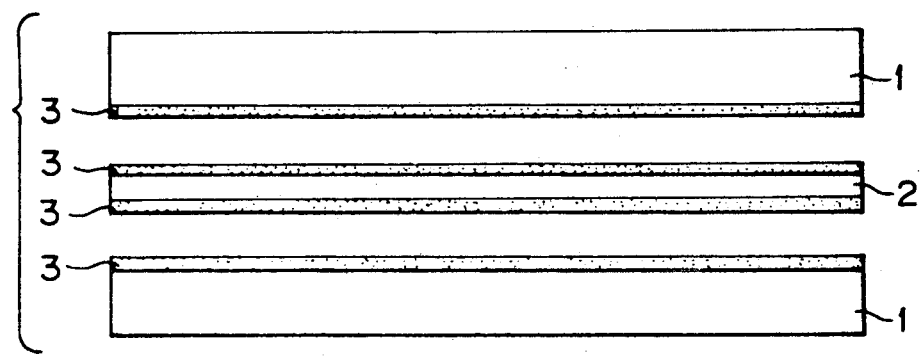
FIGS. 1 through 3 are enlarged side sectional views for illustration of the structure of the ceramics bonded products according to Examples of this invention.

(1) As shown in FIG. 1, on the bonding faces of nitride ceramics sintered bodies 1, 1 and on the surfaces of a ductile metal foil 2, a slurry prepared by dispersing in an organic solvent a powder of a group IVb transition metal or a powder of a group IVb transition metal compound capable of reacting with nitrogen, for example, is applied by coating and heat-dried to form layers 3 of the group IVb transition metal powder or the group IVb transition metal compound powder capable of reacting with nitrogen, which IVb transition metal powder layers 3 are superposed face to face, followed by heating in an inert atmosphere at a temperature not lower than the melting point of the intermediary layers to effect integration.

Figure 2:
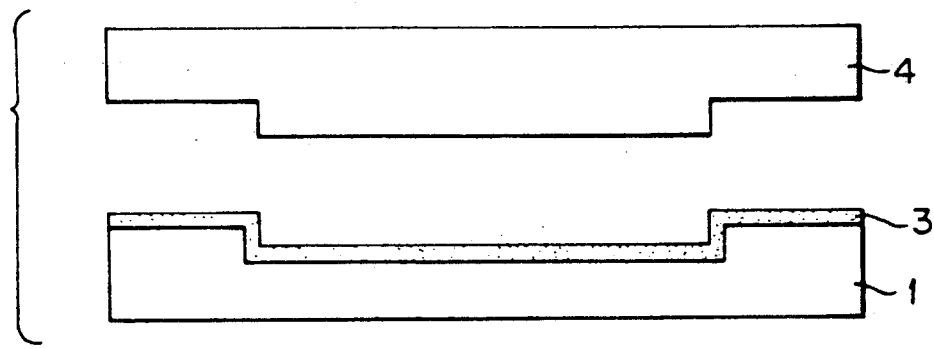

(2) When employing a ductile metal such as copper or a copper alloy as the metal member, the method (A) can be embodied as follows: As shown in FIG. 2, at the bonding face between a nitride ceramics sintered body 1 and a metal member 4, a slurry prepared by dispersing a ductile metal powder in an organic solvent, for example, is applied by coating and heat-dried to form a IVb transition metal powder layer 3. Thereafter, the IVb transition metal powder layer 3 and the ductile metal member 4 are superposed face to face, followed by heating in an inert atmosphere and at a temperature not lower than the melting point of the intermediary layer.

The method of (B)

Figure 3:
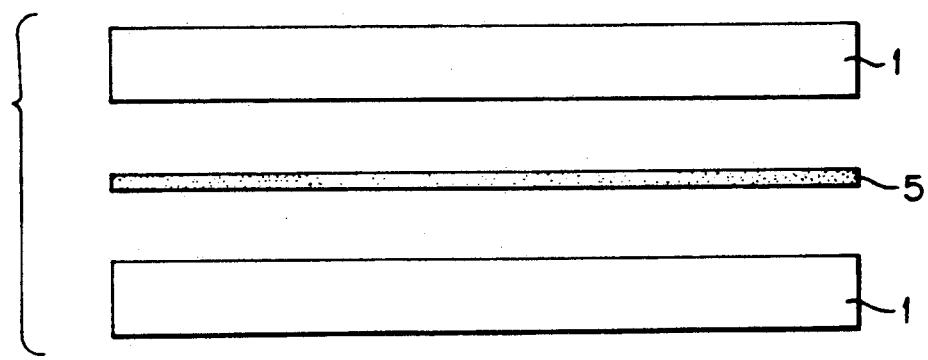

As shown in FIG. 3, a minute (for example, passing through 325 mesh) ductile metal powder together with a powder of a group IVb transition metal powder or a powder of a IVb transition metal compound capable of reacting with nitrogen are mixed in an organic solvent such as an alcohol, and the resultant slurry is dried and press molded to a desired shape to mold a compact 5 with a thickness of about 0.1 to 5 mm. The mixing ratio of the ductile metal powder and the group IVb transition metal powder is suitably within the range of ductile metal : IVb transition metal powder = 95:5 to 70:30.

Next, between the t ceramics sintered bodies 1, 1, the compact 5 is sandwiched and heating is carried out at a temperature not lower than the melting point of the compact 5 to effect integration.

The method of (C)

Figure 4:
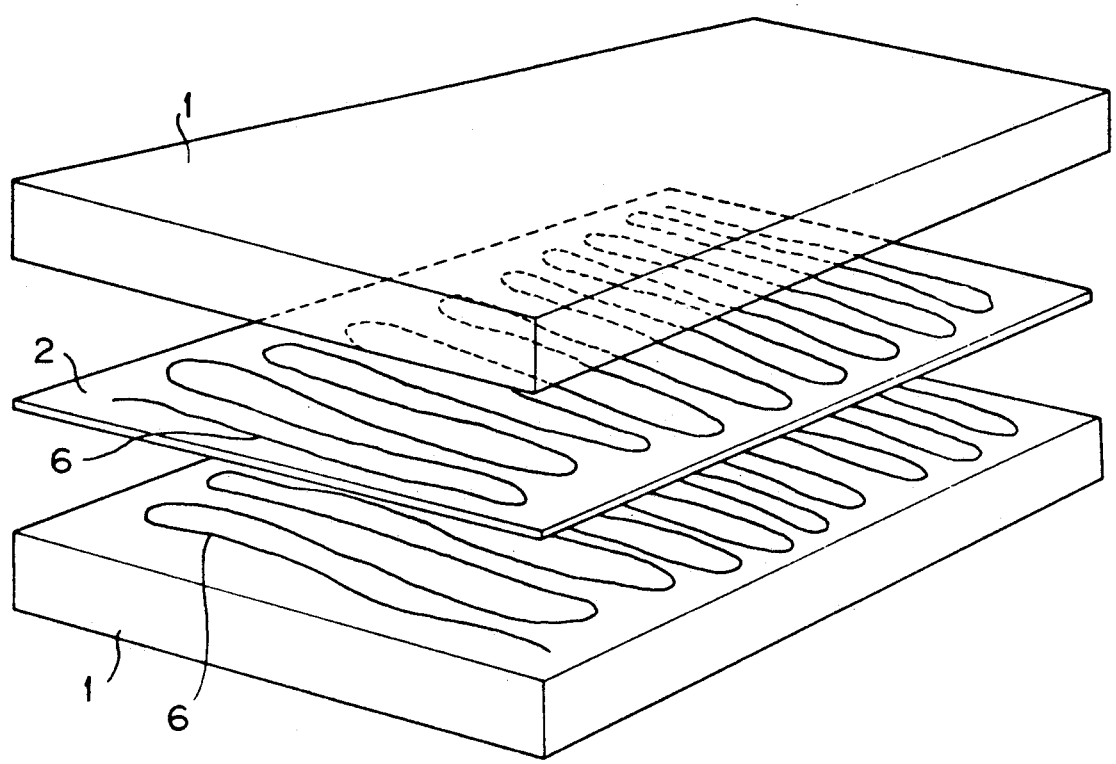
FIG. 4 is a perspective view of the same.

As shown in FIG. 4, for instance, between a nitride ceramics sintered bodies 1, 1 and a ductile metal foil 2, a group IVb transition metal is provided in a locally, nonuniformly or intermittently distributed fashion, for example, by weaving of group IVb transition metal wires, by bending thereof repeatedly on the same plane, by arrangement of a plural number of the wires in parallel, by provision of a large number of punches provided on a IVb transition metal foil, or by scattering the group IVb transition metal (in the drawing, there is shown a group IVb transition metal wire which is repeatedly bent), on which another ceramics sintered body or a metal member is superposed through a ductile metal (not necessary when a metal member comprising a group IVb metal is to be bonded), followed by heating at a temperature not lower than the melting points of the group IVb transition metal and the ductile metal to effect integration.

The method of (D)

Figure 5:
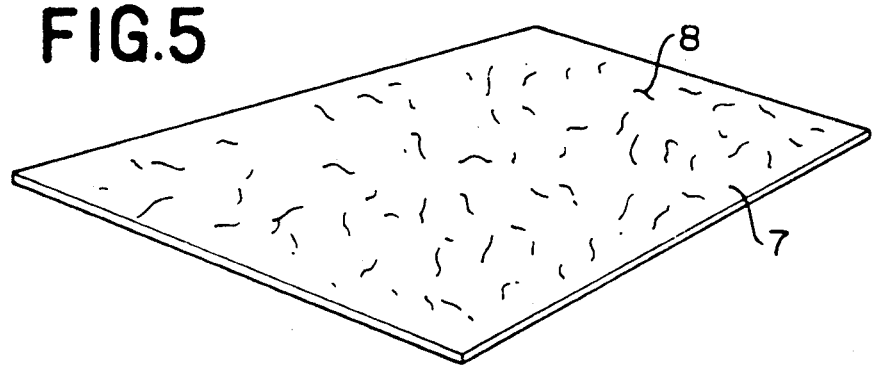
FIGS. 5 and 6 are enlarged perspective views of the pressurized powder to be used in Examples of this invention.
Figure 6:
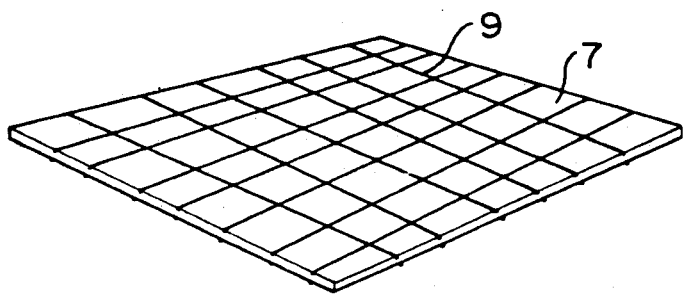

As shown in FIG. 5, in place of the compact 5 comprising the ductile metal powder and the IVb metal powder mentioned in the method of (B), a compact prepared by press molding similarly as in the method of (B) of the ductile metal powder 7 having the group IVb transition metal fiber 8 mixed into the metal member powder is employed, or, as shown in FIG. 6, nets 9 comprising ductile metal fibers are arranged on both surfaces of a compact of the metal powder 7, followed again by pressurization to have a part of the nets embedded in the compact, and the resultant product is employed. The compounding ratio of the ductile metal to the group IVb transition metal is made within the same range as the method of (B).

At the interface of the ceramics, bonded product thus bonded, nitrides of the group IVb transition metal are formed through the reaction of the nitrogen in the nitride ceramics sintered body with the group IVb transition metal or the group IVb transition metal compound capable of reacting with nitrogen, or nitrides may be formed through the group IVb transition metal nitride itself. The nitrides at the interface may be formed in various fashions, i.e., in a uniformly or evenly distributed fashion in the cases according to the method (A) and method (B), and in a locally distributed fashion such that they are distributed in a continuous or discontinuous linear fashion, in a net fashion or in a scattered fashion in the cases according to the method (C) and method (D). Moreover, the ductile metal is formed into alloy uniformly or locally with the group IVb transition metal to form alloy layers with various compositions.

The ceramics sintered body to be used in this invention may include nitride ceramics sintered bodies containing nitrides such as silicon nitrides, aluminum nitride, titanium nitride and complexes thereof, or oxynitrides such as sialon (Si-Al-O-N), etc. When the group IVb transition metal nitride is used as the intermediary material, the ceramics sintered body may be comprised of oxide type ceramics sintered bodies such as of alumina, magnesia, etc. In particular, this invention is applicable to a dense product obtainable by pressureless sintering or hot pressed sintering.

Also, the ductile metal which can be used in this invention may suitably be copper and its alloy. These (soft materials) have the following elongations:

| Pure copper | 45% |
|---|---|
| Brass | 60% |
| Bronze | 64% |
| Pure iron | 29% (comparison) |

Among them, brass is inexpensive and 60% or more elongation can be obtained with a zinc content within the range of from 20 to 40 wt. %, and therefore it is particularly suitable for this invention.

Further, the group IVb transition metal to be used in this invention may include titanium, zirconium, hafnium and others. Also, its compound capable of forming nitride by reaction with nitrogen, such as titanium dioxide ($TiO_2$) may also be used. As the group IVb transition metal, titanium is suitable from the standpoint of cost.

The ceramics bonded product thus obtained has a great bonded strength over 10 kg/mm² due to the presence interface layer of a group IVb transition metal nitride, and there is no fear of formation of crack or breaking in the vicinity of the bonded interface of the ceramics sintered body on account of relaxation of stress due to the presence of a ductile metal, even when an abrupt heat shock may be applied. In the respective methods as described above, the method of applying a slurry on the bonded surface according to the method (A) and the method (B) is suitable when bonding surfaces are of complicated shapes. Also, in the case of bonding locally or intermittently the bonding surfaces according to the method (C) and the method (D), the stress relaxation effect can be further improved, whereby generation of cracks by heat shock can effectively be prevented.

This invention is further illustrated by the following Examples.

EXAMPLE 1

A metallic titanium net with a wire diameter, of 300 μm φ, and a mesh interval of 1.5 mm was sandwiched between a ceramics sintered body comprising pressureless sintered silicon nitride and a copper plate and bonded by heating in vacuum at about 1050° C. for 5 minutes.

The ceramics bonded product thus obtained had a strength of 25 kg/mm² by shear and the cracking occurred at the portion of the ceramics sintered body.

EXAMPLE 2

At the bonded faces of two ceramic sintered bodies comprising pressureless sintered silicon nitride, a slurry of titanium powder dispersed in ethyl alcohol was applied by coating in scattered dots of 400 μm in diameter and, after drying at about 400° C. for 5 minutes, the coated faces were superposed on each other through a copper plate with a thickness of about 300 μm, followed by heating in an argon gas atmosphere at about 1050° C. to effect bonding.

The ceramics bonded product thus obtained had a shear strength of about 12 kg/mm². At the bonded interface of the bonded product of this Example, no microcrack was observed at all. However, in a comparative example, in which bonding was effected in the same manner except for applying titanium over the entire face of the ceramics sintered product, formation of microcracks was observed at the bonded interface. Thus, the product formerly unavailable due to formation of cracks became sufficiently useful by acquisition of sufficient strength.

EXAMPLE 3

Copper powder (passable through 325 mesh) and metallic titanium short fibers (fiber diameter: 300 μm φ, fiber length: 2 mm) were mixed in ethyl alcohol and dried. Then, the mixture was molded by a press into a compact of 500 μm in thickness and 10 mm in both length and width.

Next, these compacts were sandwiched between two ceramics sintered bodies comprising pressureless sintered silicon nitride and bonded by heating in an argon gas atmosphere at about 1050° C. for 5 minutes.

The thus prepared ceramics bonded product had a shear strength of 20 kg/mm², and fracture occurred at the portion of the ceramics sintered body.

We claim:

1. A process for producing a bonded multilayer product comprising the steps of:
    providing a first body comprising a first ceramic sintered material which contains nitrogen;
    providing at least a second body bondable to said first body, wherein said second body is comprised of a second ceramic sintered material or a metal;
    applying a layer comprised of titanium or a titanium compound to said first body and said second body, respectively;
    forming a composite wherein (i) the layer applied to said first body faces the layer applied to said second body and (ii) a copper or copper alloy foil is interposed therebetween; and
    heating said composite at a temperature not lower than the melting point of each of said layers, so as to cause nitrogen in said first body to react with said layer applied thereto, thereby effecting bonding of said composite.

2. A process for producing a bonded multilayer product comprising the steps of:
    providing a first body comprising a nitrogen-containing ceramic;
    providing at least a second body bondable to said first body, said second body comprising a second ceramic body or a metal member;
    forming a compact comprising copper or copper alloy powder;
    applying a layer comprised of titanium or a titanium compound to said first body and said second body, respectively;
    forming a composite wherein (i) the layer applied to said first body faces the layer applied to said second body and (ii) said copper compact is interposed therebetween; and
    heating said composite at a temperature not lower than the melting point of each of said layers, so as to cause nitrogen in said first body to react with said layer applied thereto, thereby effecting bonding of said composite.

3. A process for producing a bonded multilayer product, comprising the steps of:
    providing at least one ceramic body containing nitrogen and at least one copper or alloy member to be bonded together;
    forming a bonding layer between said ceramic body and said copper member, said bonding layer comprising titanium or a titanium compound such that said ceramic body, said copper or copper alloy member and said bonding layer comprise a multilayer structure; and
    heating said multilayer structure at a temperature not lower than the melting point of said bonding layer so as to react nitrogen from said ceramic body with titanium and bond said multilayer structure to form said bonded multilayer product.

4. A process according to claim 1, wherein said first and second bodies each comprise a nitride ceramics sintered body.

5. A process according to claim 1, wherein said applying step comprises:
    preparing a slurry comprising an organic solvent and a powder of said titanium or titanium compound;
    coating said slurry on said first body and said second body; and
    heat drying said coating to form said layer.

6. A process according to claim 1, wherein said temperature is not lower than about 1050 degree C.

7. A process according to claim 1, wherein said heating is done in a vacuum or argon gas atmosphere.

8. A process according to claim 2, wherein said first and second bodies each comprise a nitride ceramics sintered body.

9. A process according to claim 2, wherein said applying step comprises:
preparing a slurring comprising an organic solvent and a powder of said titanium or titanium compound;
coating said slurry on said first body and said second body; and
heat drying said coating to form said layer.

10. A process according to claim 2, wherein said temperature is not lower than about 1050 degree C.

11. A process according to claim 2, wherein said heating is done in vacuum or argon gas atmosphere.

12. A process according to claim 3, wherein said forming step comprises:
preparing a slurry comprising an organic solvent and a powder of said titanium or titanium compound;
coating said slurry on said ceramic body; and
heat drying said coating to form said bonding layer.

13. A process according to claim 3, wherein said forming step comprises inserting a metallic titanium member between said ceramic body and said copper member.

14. A process according to claim 3, wherein said temperature is not lower than about 1050 degree C.

15. A process according to claim 3, wherein said heating is done in a vacuum or argon gas atmosphere.

16. A process according to claim 3, wherein said bonding layer is formed by disposing on said copper or copper alloy member a coating of titanium in the form of a plurality of discontinuous dots.

* * * * *